(12) United States Patent
Tabatake et al.

(10) Patent No.: US 9,685,458 B2
(45) Date of Patent: Jun. 20, 2017

(54) DISPLAY DEVICE

(71) Applicant: Japan Display Inc., Tokyo (JP)

(72) Inventors: Hiroshi Tabatake, Tokyo (JP); Hiroyuki Kimura, Tokyo (JP); Makoto Shibusawa, Tokyo (JP); Hiroshi Nakayama, Tokyo (JP); Tetsuo Morita, Tokyo (JP); Yutaka Umeda, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/882,093

(22) Filed: Oct. 13, 2015

(65) Prior Publication Data

US 2016/0104761 A1    Apr. 14, 2016

(30) Foreign Application Priority Data

Oct. 14, 2014    (JP) ................. 2014-210142

(51) Int. Cl.
*H01L 27/12* (2006.01)
*H01L 27/32* (2006.01)

(52) U.S. Cl.
CPC ........ *H01L 27/1214* (2013.01); *H01L 27/124* (2013.01); *H01L 27/3272* (2013.01); *H01L 27/326* (2013.01)

(58) Field of Classification Search
None
See application file for complete search history.

(56) References Cited

U.S. PATENT DOCUMENTS

| 9,406,257 B2* | 8/2016 | Nakamura | ........... G09G 3/3233 |
| 2010/0079419 A1* | 4/2010 | Shibusawa | .......... H01L 27/3272 345/204 |
| 2013/0075711 A1* | 3/2013 | Kanegae | ............. H01L 27/3248 257/40 |

FOREIGN PATENT DOCUMENTS

JP    2009-175389 A    8/2009

* cited by examiner

*Primary Examiner* — Joseph Schoenholtz
(74) *Attorney, Agent, or Firm* — Typha IP LLC

(57) ABSTRACT

A display device includes a display region comprising a plurality of pixels, each pixel of the plurality of pixels comprises a light emitting element which includes a pixel electrode, a conductive layer below the pixel electrode and configured to receive a specified electric voltage, and a thin film transistor below the pixel electrode and the conductive layer, wherein the thin film transistor comprises a semiconductor layer which includes a channel region, a gate electrode which is overlapping the channel region, a first electrode electrically connected to the semiconductor layer and the pixel electrode, and a second electrode electrically connectable to a power supply line, wherein the conductive layer includes an overlapped region which overlaps with the channel region, and the first electrode extends so as to cover the gate electrode at the overlapped region.

10 Claims, 9 Drawing Sheets

DISPLAY DEVICE

CROSS REFERENCE TO RELATED APPLICATIONS

This application is based upon and claims the benefit of priority from the prior Japanese Patent Application No. 2014-210142, filed on Oct. 14, 2014, the entire contents of which are incorporated herein by reference.

FIELD

The present invention relates to a display device.

BACKGROUND

An organic EL display device is known as one of display devices provided with a self-light emitting element in a pixel circuit.

A common electrode, a pixel electrode and a light emitting element including an organic layer sandwiched therebetween are disposed in each pixel of the organic EL display device. Holes and electrons respectively injected from the pixel electrode and the common electrode are recombined in the organic layer, so that light is emitted.

In addition to the light emitting element, circuit components such as plural switching elements and elements constituting capacitance portions are disposed in the pixel circuit of the organic EL display device.

JP 2009-175389 A discloses to provide a structure which can prevent harmful effects caused by overlap between a scanning line to supply a signal to each pixel circuit of a pixel array part and an auxiliary wiring in an outer periphery of the pixel array part.

Improvement in fineness of pixels is required in the display device as stated above.

However, when the size of the pixel is reduced, the arrangement and structure of the circuit components are limited.

Embodiments of the invention are made in view of the above problems, and one of the objects is to provide a display device including a circuit component of a structure which can contribute to the improvement in fineness.

SUMMARY

A display device includes a display region comprising a plurality of pixels, each pixel of the plurality of pixels comprises a light emitting element which includes a pixel electrode, a conductive layer below the pixel electrode and configured to receive a specified electric voltage, and a thin film transistor below the pixel electrode and the conductive layer, wherein the thin film transistor comprises a semiconductor layer which includes a channel region, a gate electrode which is overlapping the channel region, a first electrode electrically connected to the semiconductor layer and the pixel electrode, and a second electrode electrically connectable to a power supply line, wherein the conductive layer includes an overlapped region which overlaps with the channel region, and the first electrode extends so as to cover the gate electrode at the overlapped region.

DESCRIPTION OF EMBODIMENTS

Hereinafter, a display device of respective embodiments of the invention will be described with reference to the drawings. However, the invention can be carried out in various modes within the scope not departing from the gist thereof and should not be interpreted as being limited to the contents of the embodiments illustrated below.

First Embodiment

Figure 1:
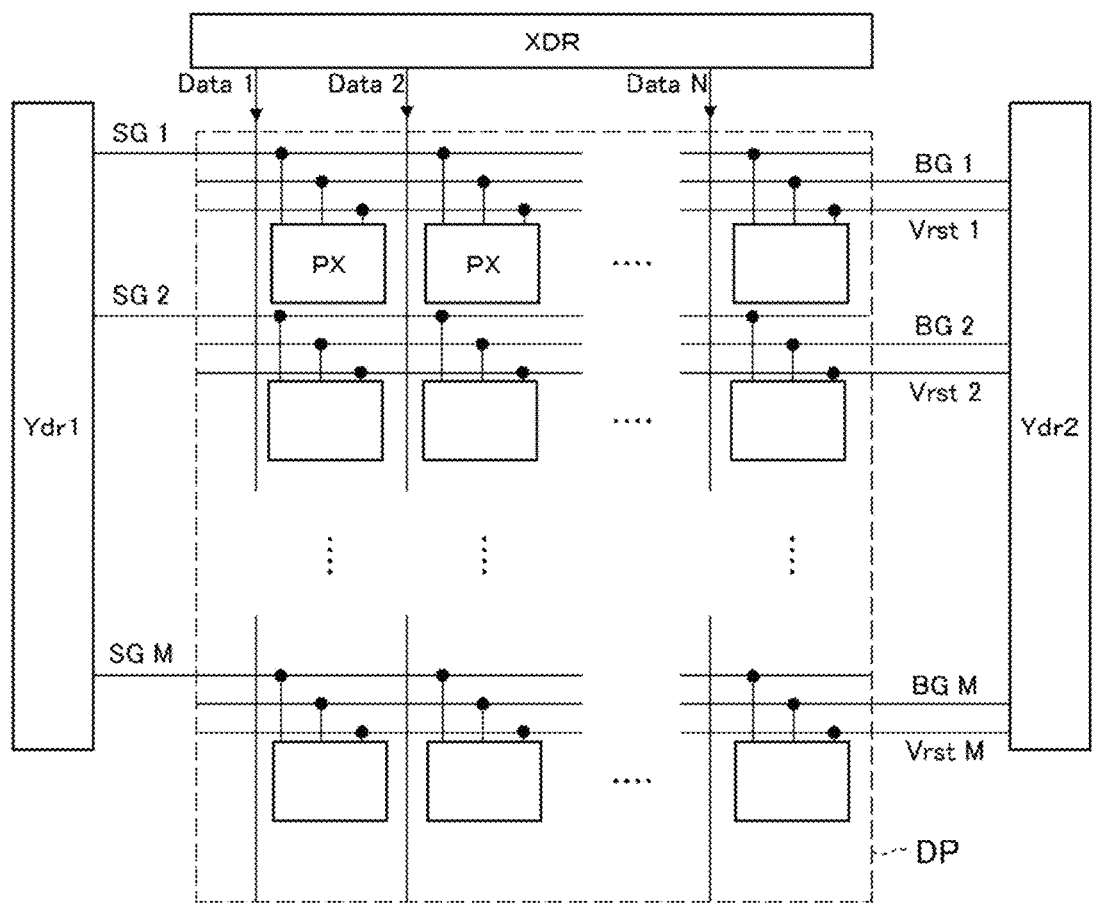
FIG. 1 is a plan view schematically showing a display device of a first embodiment.

FIG. 1 is a schematic plan view for explaining a display device of a first embodiment. In a display region DP of the display device of the embodiment, plural pixels PX as objects of display control are disposed in matrix form, and an electroluminescence element (light emitting element) is disposed in each of the pixels PX. The light emitting element of each of the pixels PX includes an organic layer provided with a light emitting layer. Signals from a data line drive circuit XDR, a first scanning line drive circuit Ydr1 and a second scanning line drive circuit Ydr2, which are disposed outside the display region DP, are inputted to each of the pixels PX.

A first scanning line BG, a second scanning line SG, a reset wiring Vrst and a data line Data are connected to each of the pixels PX of the display region DP. The first scanning lines BG 1 to BG M, the second scanning lines SG 1 to SG M, and the reset wirings Vrst 1 to Vrst M are respectively disposed to be parallel to an X-direction, and the data lines Data 1 to Data N are disposed to be parallel to a Y-direction.

Figure 2:
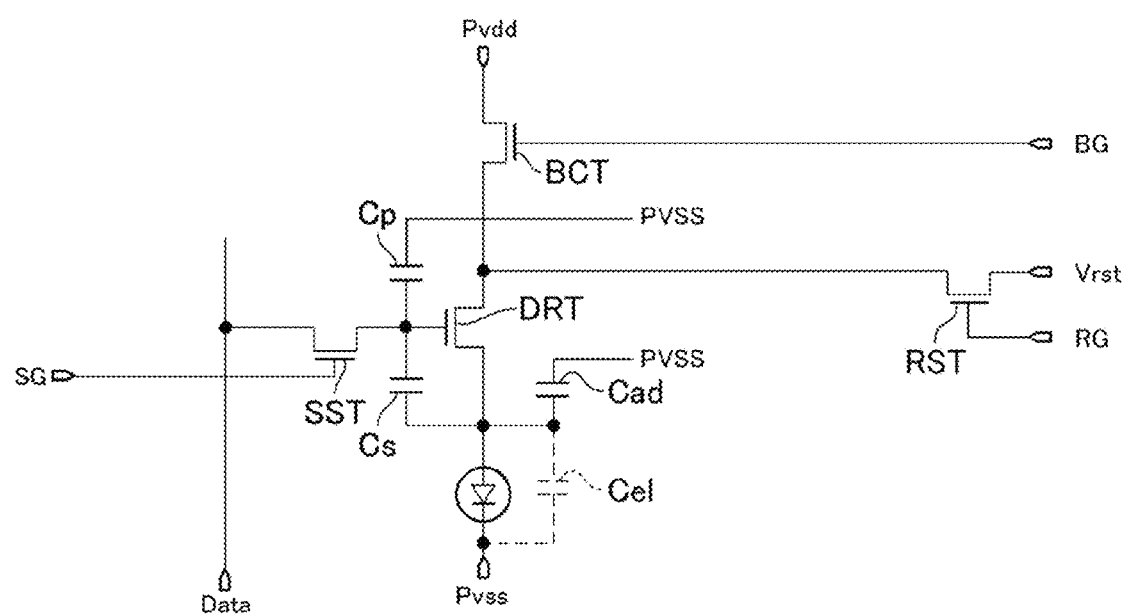
FIG. 2 is a view for explaining a pixel circuit of the display device of the first embodiment.

FIG. 2 is a view for explaining a structure of a pixel circuit of the display device. The pixel circuit of the display device of the embodiment includes a pixel switch SST, a drive transistor DRT, an output switch BCT, a storage capacitance Cs, an auxiliary capacitance Cad and an element capacitance Cel. Further, the second scanning line drive circuit part Ydr2 includes a reset switch RST. The pixel switch SST and the like are constituted by thin-film transistors.

The output switch BCT and the drive transistor DRT are connected in series to the light emitting element between a high-potential voltage power supply Pvdd and a low-potential voltage power supply Pvss. A gate electrode of the output switch BCT is connected to the first scanning line BG, and ON/OFF control is performed by a control signal from the first scanning line BG. The output switch BCT controls a light emitting period of the light emitting element.

A gate electrode of the drive transistor DRT is connected to the pixel switch SST and the storage capacitance Cs. A data signal inputted through the pixel switch SST is written in the storage capacitance Cs, so that the signal is maintained as a gate control voltage, and current supplied from the drive transistor DRT to the light emitting element is controlled. Besides, the storage capacitance Cs holds a potential difference between the gate electrode and the source electrode of the drive transistor DRT.

A gate electrode of the pixel switch SST is connected to the second scanning line SG, and a source electrode thereof is connected to the data line Data. A data signal or an initial potential is inputted to the pixel switch SST from the data line Data in synchronization with a scanning signal from the second scanning line SG.

The reset switch RST is disposed in the second scanning line drive circuit Ydr2. When a potential to cause an ON state is inputted from a wiring RG, a reset potential is supplied to each pixel circuit from the reset wiring Vrst. When the output switch BCT is in an OFF state, the pixel switch SST is in an OFF state, and the reset switch RST is in the ON state, the potential of the source-drain electrode of the drive transistor DRT is set to the same potential as the potential of a reset power supply.

The writing operation of the data signal is performed when the data signal from the data line Data is inputted to the gate electrode of the drive transistor DRT in synchronization with the control signal from the second scanning line SG, which turns on the pixel switch SST ON, and the control signal from the first scanning line BG, which turns on the output switch BCT. Besides, the auxiliary capacitance Cad is an element provided to adjust an amount of current supplied to the light emitting element. Since only the element capacitance Cel is insufficient in the display device of the embodiment, the auxiliary capacitance Cad is secured.

Figure 3:
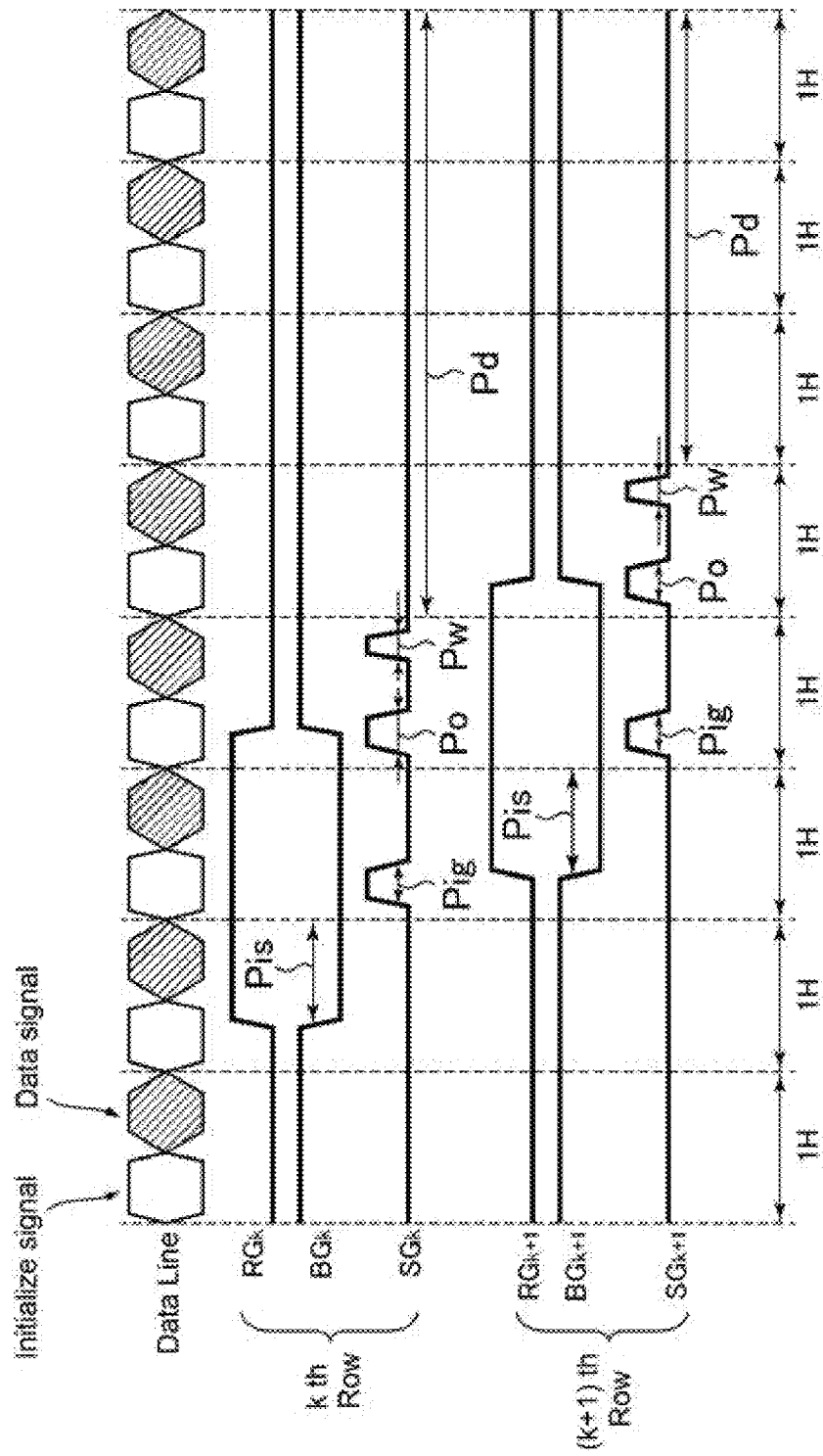
FIG. 3 is a view showing a timing chart of signals inputted from respective wirings connected to the pixel circuit of the first embodiment.

The operation of the pixel circuit shown in FIG. 2 will be described. FIG. 3 is a timing chart showing the operation of the pixel circuit. In FIG. 3, a period of 1H is one line period (one horizontal period). As an example, a k-th row and a (k+1)th row as a next row are shown. Incidentally, in the pixel circuit shown in FIG. 2, all the transistors are of N-channel type, and when signals to control the gates thereof are at high level, the transistors are turned ON (conducted), and when the signals are at low level, the transistors are turned OFF (non-conducted). Although not shown, when the transistor is of P-channel type, the signal level and the ON/OFF operation of the transistor are reversed.

First, a source initialization operation is performed in a period indicated by Pis. In the source initialization operation, at the k-th row, the control signal of the second scanning line SGk is set to the low level, the control signal of the first scanning line BGk is set to the low level, and the control signal of the wiring RGk is set to the high level.

The output switch BCT and the pixel switch SST are respectively turned OFF, the reset switch RST is turned ON, and the source initialization operation starts. When the reset switch RST is turned on, the source electrode and the drain electrode of the drive transistor DRT are reset to the same potential as the potential of the reset power supply (potential supplied to the reset wiring Vrst), and the source initialization operation is completed. Here, the potential of the reset power supply is set to, for example, −2V.

Next, in a period indicated by Pig, a gate initialization operation is performed. In the gate initialization operation, at the k-th row, the control signal of the second scanning line SGk is set to the high level, the control signal of the first scanning line BGk is set to the low level, and the control signal of the wiring RGk is set to the high level. The output switch BCT is turned OFF, the pixel switch SST and the reset switch RST are turned ON, and the gate initialization operation starts.

In the gate initialization period Pig, an initialize signal Vini (initialize voltage) outputted from the data line is applied to the gate electrode of the drive transistor DRT through the pixel switch SST. Thereby, the potential of the gate electrode of the drive transistor DRT is reset to the potential corresponding to the initialize signal Vini, and the information of the former frame is initialized. The voltage level of the initialize signal Vini is set to, for example, 2 V.

Subsequently, in a period indicated by Po, an offset cancel operation is performed. In the offset cancel operation, at the k-th row, the control signal of the second scanning line SGk is set to the high level, the control signal of the first scanning line BGk is set to the high level, and the control signal of the wiring RGk is set to the low level. Thereby, the reset switch RST is turned OFF, the pixel switch SST and the output switch BCT are turned ON, and the offset cancel operation of the threshold of the drive transistor DRT starts.

In the offset cancel period Po, the initialize signal Vini is applied to the gate electrode of the drive transistor DRT through the data line and the pixel switch SST, and the potential of the gate electrode of the drive transistor DRT is fixed.

Besides, the output switch BCT is in the ON state, and current flows into the drive transistor DRT from the high potential power supply Pvdd. The initial value of the potential of the source electrode of the drive transistor DRT is the potential (reset potential Vrst) written in the source initialization period Pis, and the potential shifts to a high potential side while the current flowing through the drain electrode and the source electrode of the drive transistor DRT is gradually decreased and while variation in TFT characteristics of the drive transistor DRT is absorbed and compensated. In the embodiment, the offset cancel period Po is set to, for example, approximately 1 μsec.

The potential of the source electrode of the drive transistor DRT becomes (Vini−Vth) at the end time of the offset cancel period Po. Incidentally, Vini denotes the voltage value of the initialize signal Vini, and Vth denotes the threshold voltage of the drive transistor DRT. Thereby, the voltage between the gate electrode and the source electrode of the drive transistor DRT reaches a cancel point (Vgs=Vth), and a potential difference corresponding to the cancel point is stored (held) in the storage capacitance Cs.

Subsequently, a data signal writing operation is performed in a period indicated by Pw. In the data signal writing period Pw, at the k-th row, the control signal of the second scanning line SGk is set to the high level, the control signal of the first scanning line BGk is set to the high level, and the control signal of the wiring RGk is set to the low level. Then, the pixel switch SST and the output switch BCT are turned ON, the reset switch RST is turned OFF, and the data signal writing operation starts.

In the data signal writing period Pw, a data signal Vsig is written to the gate electrode of the drive transistor DRT through the pixel switch SST from the data line Data. Besides, current flows from the high potential power supply Pvdd to the low potential power supply line through the output switch BCT and the drive transistor DRT and through the light emitting element OLED. By the operation up to here, the data signal Vsig and the potential based on the threshold voltage acquired at the time of offset cancel are written to the gate of the drive transistor DRT, and the variation in mobility of the drive transistor DRT is corrected.

Finally, a display operation is performed in a period indicated by Pd. In the display period Pd, the control signal of the second scanning line SG is set to the low level, the control signal of the first scanning line BG is set to the high level, and the control signal of the wiring RG is set to the low level. The output switch BCT is turned ON, the pixel switch SST and the reset switch RST are turned OFF, and the display operation starts.

The drive transistor DRT outputs a drive current Iel having a current amount corresponding to the gate control voltage written in the storage capacitance Cs. The drive current Iel is supplied to the light emitting element OLED. Thereby, the light emitting element OLED emits light at brightness corresponding to the drive current Iel, and the display operation is performed. The light emitting element OLED keeps the light emitting state until the control signal of the first scanning line BG becomes again the low level after one frame period.

The source initialization operation, the gate initialization operation, the offset cancel operation, the data signal writing operation, and the display operation are sequentially repeatedly performed for the respective pixels PX after the k-th row, so that a desired image is displayed.

Incidentally, a parasitic capacitance Cp is generated between the gate electrode of the drive transistor DRT and a wiring to which high potential voltage or low potential voltage is supplied. The existence of the parasitic capacitance Cp may cause undesirable capacitive coupling when the gate of the drive transistor DRT is changed to the desired potential in the offset cancel operation and the data signal writing operation.

Here, the structure of circuit components in the embodiment will be specifically described.

Figure 4:
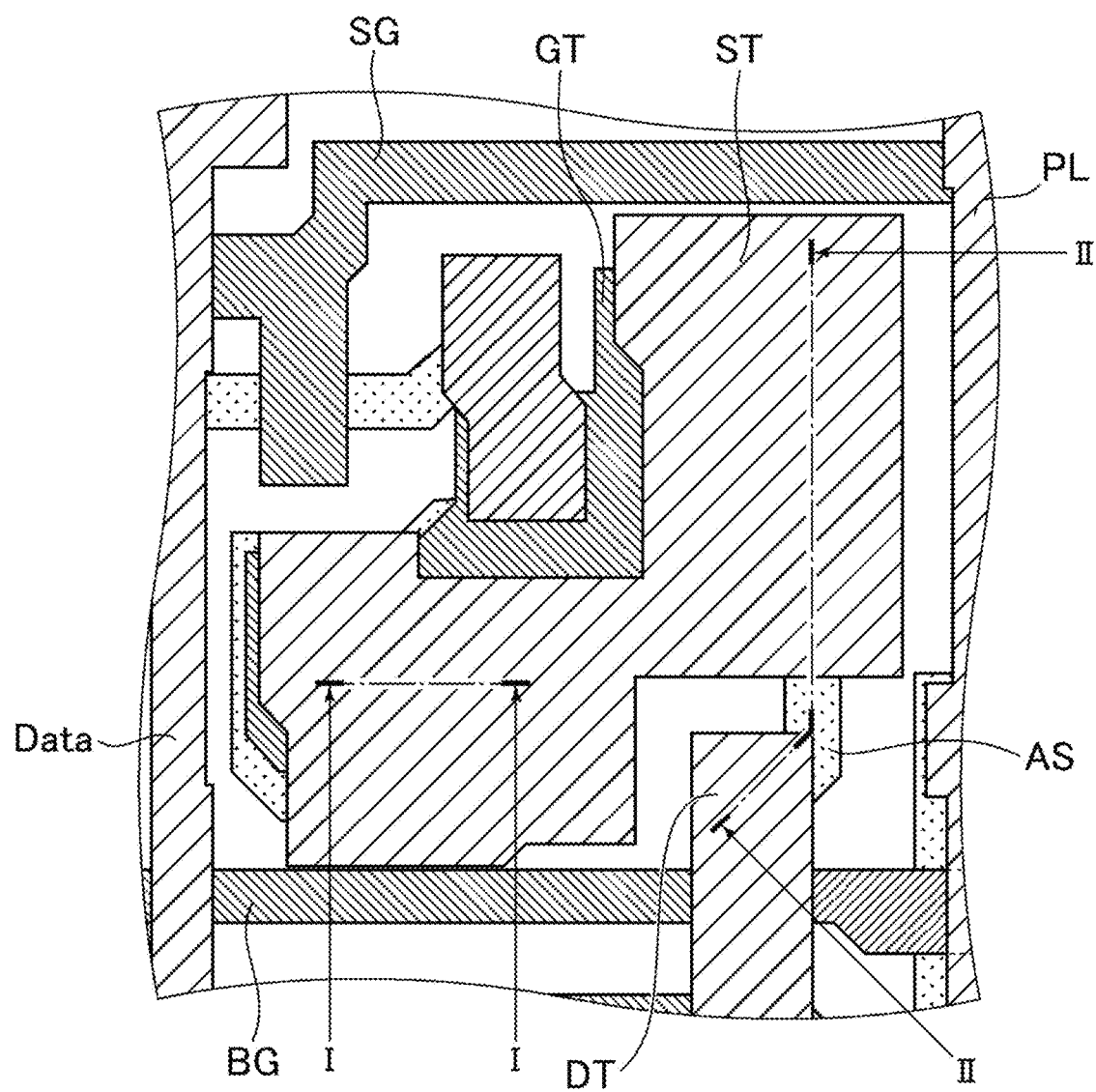
FIG. 4 is a view for explaining a planar structure of a pixel of the display device of the first embodiment.

FIG. 4 shows a planar structure of a subpixel in the embodiment, and four subpixels constitute one main pixel in the embodiment. A first scanning line BG and a second scanning line SG, which are disposed in an X-direction, and a data line Data and a power supply line PL, which are disposed in a Y-direction, are disposed.

A drive transistor DRT of double-gate structure is disposed at a place of a II-II section on the center right side, and a pixel switch SST is disposed on the left upper place. Besides, in the embodiment, a metal layer not shown in FIG. 4 covers about ¾ of the area of the subpixel. A gate electrode GT and a source electrode ST of the drive transistor DRT are disposed in a relatively wide area in the subpixel.

Figure 5A:
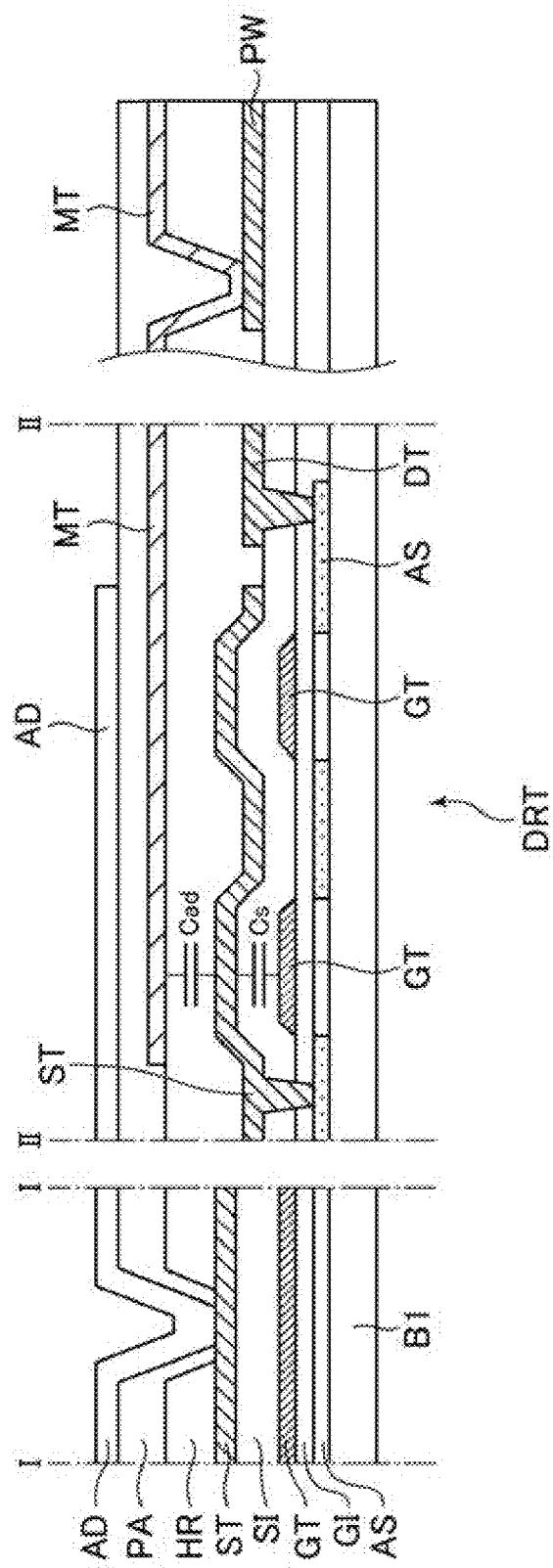
FIG. 5A is a view showing states of a I-I section, a II-II section and a section outside a display region in FIG. 3.

FIG. 5A corresponds to a I-I section in FIG. 4, the II-II section, and a specified section outside the display region DP. Although the metal layer MT, a pixel electrode AD, and upper components including HR and PA are omitted in FIG. 4 for convenience, a metal layer MT and the like are shown in the sectional view of FIG. 5A. As shown in these drawings, the I-I section corresponds to a contact part between the source electrode ST of the drive transistor DRT and a pixel electrode AD, and the II-II section structure.

A not-shown organic layer and a common electrode are disposed above the pixel electrode AD, and these constitute the light emitting element. The pixel electrode AD is individually disposed in each pixel and functions as an anode electrode (anode). The common electrode functions as a cathode electrode (cathode) common to the plural pixels. In the embodiment, the pixel electrode AD includes a transparent conductive film (for example, ITO: Indium Tin Oxide) and a reflective conductive film composed of a reflective metal such as aluminum or silver. The common electrode includes a transparent conductive film. Accordingly, light emitted from the light emitting element OLED is outputted toward the common electrode.

Besides, the drive transistor DRT of a top gate type thin film transistor is disposed below the pixel electrode AD. The drive transistor DRT includes a semiconductor layer AS formed on a substrate B1, the gate electrode GT, and the source electrode ST and a drain electrode DT which are respectively connected to the semiconductor layer AS through contact holes.

A portion of the semiconductor layer AS planarly overlapping the gate electrode GT becomes a channel region. Voltage is applied to the gate electrode GT, so that current inputted from the power supply line PL through the drain electrode DT is controlled. Besides, processing is performed to add an impurity to a portion of the semiconductor layer AS not planarly overlapping the gate electrode GT, so that the electric resistance is reduced and the portion functions as a conductor.

A gate insulating film GI composed of silicon oxide (SiOx) or silicon nitride (SiNy) is disposed between the semiconductor layer AS and the gate electrode GT. Besides, the gate insulating film GI is covered with an interlayer insulating film SI (first insulating layer) composed of an inorganic insulating film of silicon oxide (SiOx), silicon nitride (SiNy) or the like. The source electrode ST and the drain electrode DT are connected to the impurity-added regions of the semiconductor layer AS through the contact holes formed in the gate insulating film GI and the interlayer insulating film SI.

Besides, a flattening layer HR (second insulating layer) to reduce a step difference caused by the drive transistor DRT and the like is disposed on an upper side of the drive transistor DRT. The flattening layer HR is composed of an organic insulating film.

In the display device of the embodiment, the metal layer MT is disposed on the flattening layer HR, and a passivation layer PA (third insulating layer) composed of an inorganic insulating film of silicon nitride or the like is disposed between the metal layer MT and the pixel electrode AD. The low-potential voltage power supply Pvss is supplied to the metal layer MT from a power supply wiring PW disposed outside the display region DP, and an auxiliary capacitance Cad is formed between the pixel electrode AD and the metal layer MT. Besides, in the embodiment, an overlapping area between the metal layer MT and the pixel electrode AD is made as wide as possible in order to increase the auxiliary capacitance Cad, and the metal layer MT is formed so as to cover a place except for the contact part between the pixel electrode AD and the source electrode ST.

Figure 5B:
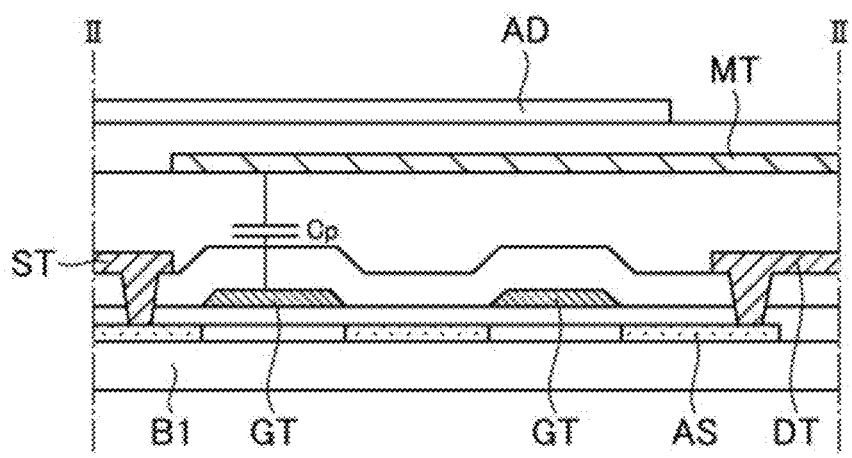
FIG. 5B is a view for explaining a pixel structure of a display device of a comparative example.

Here, especially, in the drive transistor DRT positioned below the metal layer MT in the display device of the embodiment, the source electrode ST extends to an upper side of the channel region and intervenes between the gate electrode GT overlapping the channel region and the metal layer MT. FIG. 5B is a view showing a comparative example. As shown in the drawing, when the source electrode ST does not extend to the upper side of the channel region, a parasitic capacitance Cp is generated between the gate electrode GT overlapping the channel region and the metal layer MT. On the other hand, when the source electrode ST extends as in the embodiment of FIG. 5A, not only the generation of the parasitic capacitance Cp is suppressed, but also the new auxiliary capacitance Cad is generated between the source electrode ST and the metal layer MT, and the storage capacitance Cs between the source electrode ST and the gate electrode GT increases. Thus, as in FIG. 5A, the generation of the parasitic capacitance Cp is suppressed and the auxiliary capacitance Cad and the storage capacitance Cs can be further increased by adopting the drive transistor DRT in which the source electrode ST covers the channel region and the gate electrode GT located on the upper side thereof. Accordingly, the efficient arrangement of the circuit components and the improvement in fineness can be attained.

Figure 6A:
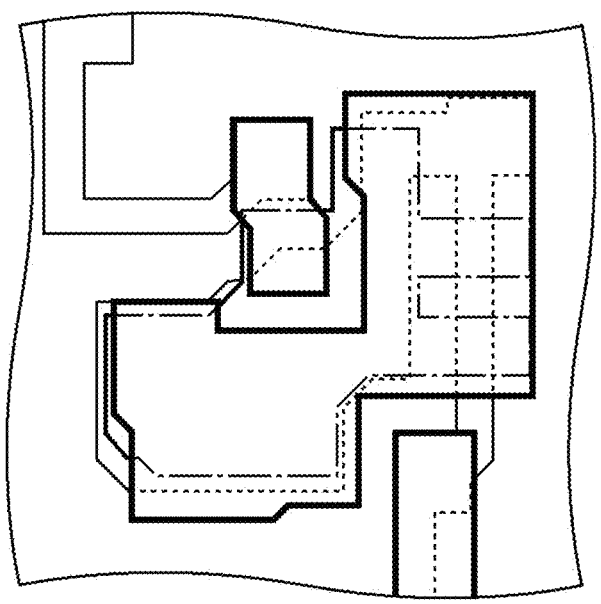
FIG. 6A is a view for explaining planar shapes of respective layers constituting a pixel of the display device of the first embodiment.
Figure 6B:
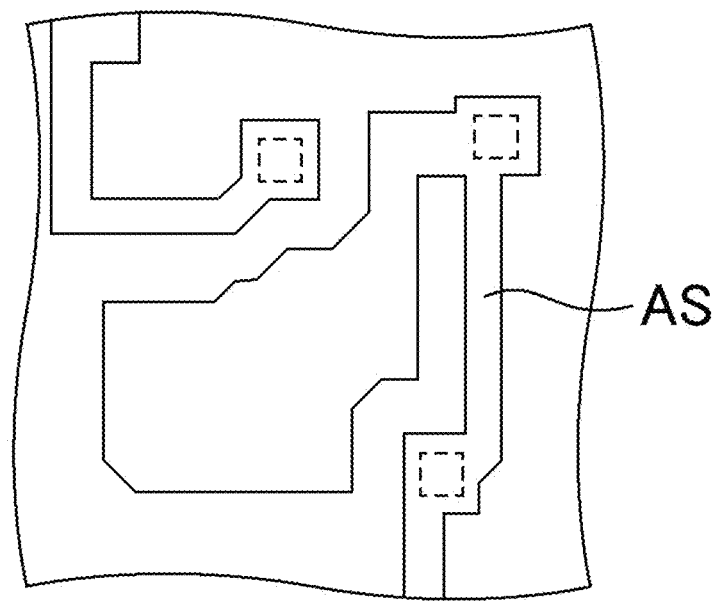
FIG. 6B is a view for explaining the planar shapes of the respective layers constituting the pixel of the display device of the first embodiment.
Figure 6C:
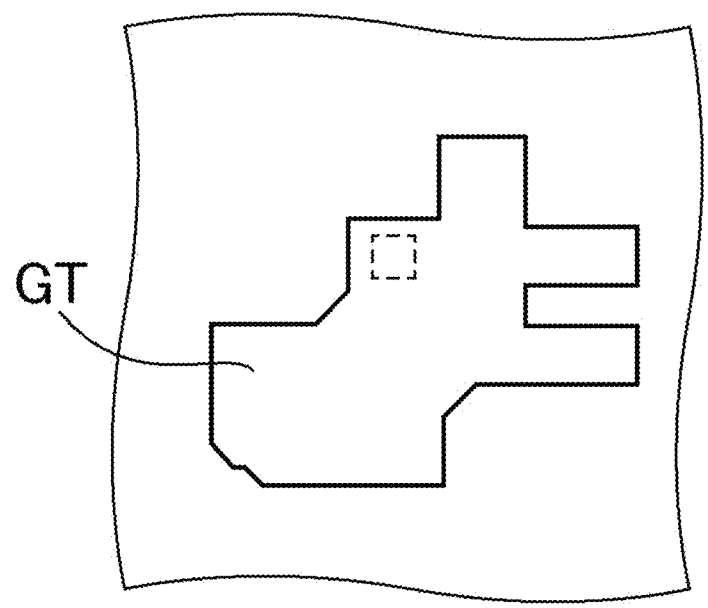
FIG. 6C is a view for explaining the planar shapes of the respective layers constituting the pixel of the display device of the first embodiment.
Figure 6D:
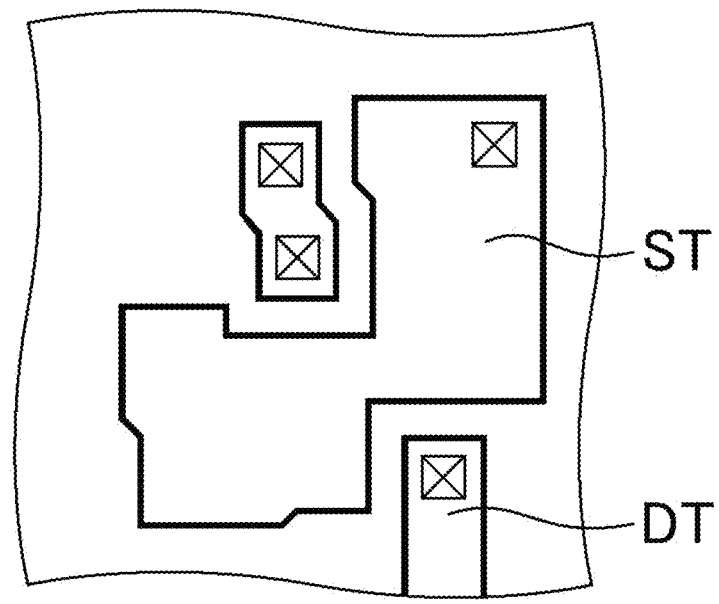
FIG. 6D is a view for explaining the planar shapes of the respective layers constituting the pixel of the display device of the first embodiment.
Figure 6E:
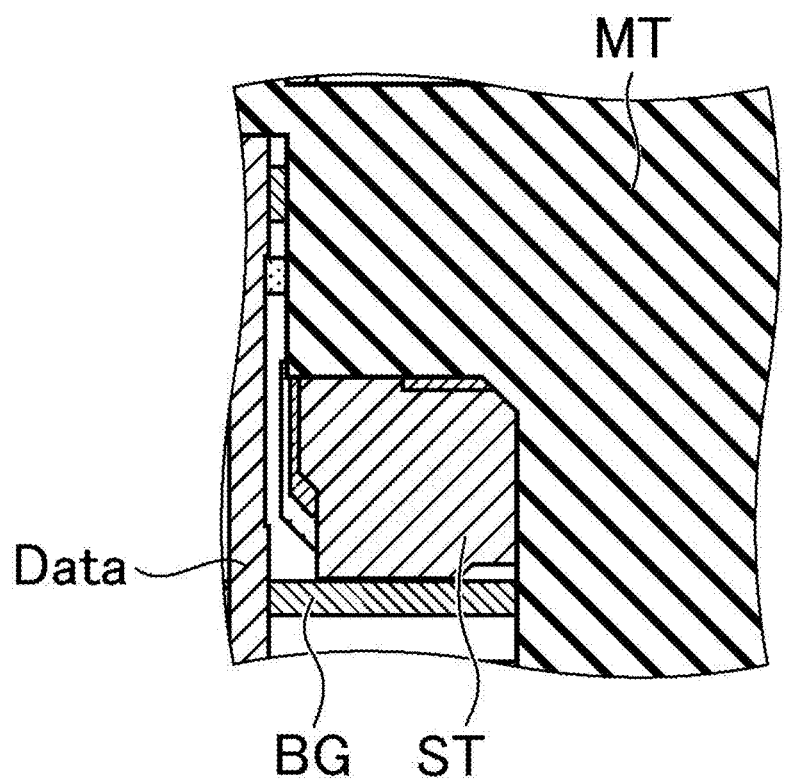
FIG. 6E is a view for explaining the planar shapes of the respective layers constituting the pixel of the display device of the first embodiment.

FIG. 6A to FIG. 6E are views for explaining the planar shape of constituent layers of the drive transistor DRT and the like in the pixel of the display device of the embodiment in detail. FIG. 6B to FIG. 6E show the planar shape of the respective layers constituting the drive transistor DRT and the metal layer MT in FIG. 6A. Specifically, FIG. 6B shows a formation region of the semiconductor layer AS, FIG. 6C shows a formation region of the gate electrode GT formed above the semiconductor layer AS, FIG. 6D shows a formation region of the source electrode ST and the drain electrode DT formed above the gate electrode GT, and FIG. 6E shows a formation region of the metal layer MT formed above the source electrode ST and the drain electrode DT.

In the display device of the embodiment, the channel region of the semiconductor layer AS (formation region of the gate electrode GT overlapping the channel region) and the impurity regions sandwiching the channel region overlap the formation region of the source electrode ST and the formation region of the metal layer MT. In other words, the region where current flows in the semiconductor layer AS of the drive transistor DRT (the region between the connection point to the source electrode ST and the connection point to the drain electrode DT) planarly overlap the formation region of the metal layer MT, and the formation region of the source electrode ST extends between the metal layer MT and the channel region of the semiconductor layer AS.

Incidentally, broken line frames and the like in FIG. 6B to FIG. 6D correspond to connection points through contact holes. Besides, the wiring layer disposed in the upper left portion of FIG. 6D is for supplying a data signal from the pixel switch SST to the gate electrode GT, and the wiring layer is connected to the semiconductor layer constituting the pixel switch SST and the gate electrode GT through the contact holes.

Incidentally, although the drive transistor DRT has the double gate structure in the display device of the embodiment, no limitation is made to this. The drive transistor DRT may be a single gate structure thin film transistor or a triple gate structure thin film transistor. Besides, although the two channel regions in the double gate structure and the source electrode ST are desired to planarly overlap each other as in the embodiment, the scope of the invention includes also a case where the source electrode ST partially overlaps one channel region and does not overlap the other channel region. Besides, although the source electrode ST is desired to planarly overlap the three impurity regions sandwiching the two channel regions as shown in FIG. 5A, the scope of the invention includes also a case where for example, the source electrode ST does not planarly overlap one of the three impurity regions.

Incidentally, although the light emitting element is the organic electroluminescence element in the display device of the embodiment, no limitation is made to this. The light emitting element may be, for example, another light emitting element such as a quantum-dot light emitting diode (QLED). Besides, although the common electrode functions as the cathode, and the pixel electrode AD functions as the anode, the low-potential voltage power supply Pvss may be supplied from the output switch BCT so that the common electrode functions as the anode, and the pixel electrode AD functions as the cathode.

Besides, the power supply wiring PW connected to the metal layer MT at the outside of the display region DP may be formed in the same process and of the same material as those of the source electrode ST, or may be formed in the same process and of the same material as those of the gate electrode GT. The high-potential voltage power supply Pvdd may be inputted from the power supply wiring PW.

The invention is not limited to the embodiments described above, and various modifications can be made. One of ordinary skill in the art can easily conceive various modified examples and corrected examples within the scope of the concept of the invention, and those modified examples and the corrected examples would fall within the scope of the invention. Besides, even if the above-described respective embodiments are suitably modified by addition of a component, omissions thereof, or design change by one of ordinary skill in the art, or by addition of a process, omission thereof or condition change, those fall within the scope of the invention as long as the gist of the invention is maintained.

What is claimed is:

1. A display device comprising:
   a display region including a plurality of pixels,
   each of the plurality of pixels comprises:
   a thin film transistor;
   a light emitting element including a pixel electrode connected to a high-potential voltage power supply via the thin film transistor, and a common electrode connected to a low-potential voltage power supply; and
   a conductive layer below the pixel electrode, the conductive layer connected to the low-potential voltage power supply,
   the thin film transistor comprises:
   a semiconductor layer which includes a channel region;
   a gate electrode over the channel region;
   a first electrode electrically connected between the semiconductor layer and the pixel electrode and
   a second electrode electrically connected between the semiconductor layer and the high-potential voltage power supply,
   wherein
   the conductive layer includes an overlapped region which overlaps with the pixel electrode, and
   the first electrode extends between the overlapped region of the conductive layer and the gate electrode.

2. The display device according to claim 1,
   wherein the semiconductor layer includes impurity-added regions at both sides of the channel region,
   the conductive layer overlaps with the impurity-added regions regions, and
   the first electrode overlaps with the impurity-added regions.

3. The display device according to claim 1,
   wherein the conductive layer is connected to at least two pixels of the plurality of pixels.

4. The display device according to claim 1, wherein
   a first insulating layer is located between the gate electrode and the first electrode,
   a second insulating layer is located between the first electrode and the conductive layer, and a third insulating layer is located between the conductive layer and the pixel electrode.

5. A display device comprising:

a display region including a plurality of pixels, each of the plurality of pixels comprises:

a light emitting element including a pixel electrode connected to a high-potential voltage power supply via the thin film transistor, and a common electrode connected to a low-potential voltage power supply; and a conductive layer below the pixel electrode, the conductive layer connected to the low-potential voltage power supply, the thin film transistor comprises:

a semiconductor layer which includes a channel region;

a gate electrode over the channel region;

a first electrode electrically connected between the semiconductor layer and the pixel electrode; and a second electrode electrically connected between the semiconductor layer and the high-potential voltage power supply, wherein the gate electrode, the first electrode, the conductive layer and the pixel electrode are overlapped each other at an overlapped region and are stacked in this order.

6. The display device according to claim 5, wherein the semiconductor layer includes impurity-added regions at both sides of the channel region, the conductive layer overlaps with the impurity-added regions, and the first electrode overlaps with the impurity-added regions.

7. The display device according to claim 5, wherein the conductive layer is connected to at least two pixels of the plurality of pixels.

8. The display device according to claim 5, wherein a first insulating layer is located between the gate electrode and the first electrode, a second insulating layer is located between the first electrode and the conductive layer, and a third insulating layer is located between the conductive layer and the pixel electrode.

9. The display device according to claim 1, further comprising:

a scanning line formed of a same layer as the gate electrode of the transistor; and a data line formed of a same layer as the first electrode.

10. The display device according to claim 5, further comprising:

a scanning line formed of a same layer as the gate electrode of the transistor; and a data line formed of a same layer as the first electrode.

* * * * *